(12) United States Patent
Chae

(10) Patent No.: US 7,525,143 B2
(45) Date of Patent: Apr. 28, 2009

(54) DRAM DEVICE HAVING CAPACITOR

(75) Inventor: Hee-Il Chae, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 489 days.

(21) Appl. No.: 11/302,702

(22) Filed: Dec. 14, 2005

(65) Prior Publication Data

US 2006/0131632 A1 Jun. 22, 2006

(30) Foreign Application Priority Data

Dec. 22, 2004 (KR) .................. 10-2004-0110503

(51) Int. Cl.
*H01L 27/108* (2006.01)
(52) U.S. Cl. ................ 257/306; 438/244; 257/E27.086
(58) Field of Classification Search ................. 257/306, 257/E27.086
See application file for complete search history.

(56) References Cited

U.S. PATENT DOCUMENTS

| 6,136,600 | A | 10/2000 | Sato et al. |
| 6,573,548 | B2 | 6/2003 | Leung et al. |
| 6,707,091 | B2 | 3/2004 | Aihara |
| 6,774,423 | B2 * | 8/2004 | Kubo ........................ 257/303 |
| 6,794,704 | B2 | 9/2004 | Yates et al. |
| 7,148,555 | B2 | 12/2006 | Yates et al. |
| 2001/0002053 | A1 | 5/2001 | Kwok et al. ................ 257/296 |
| 2002/0086493 | A1 | 7/2002 | Kubota et al. |
| 2004/0232462 | A1* | 11/2004 | Takeuchi .................... 257/296 |

FOREIGN PATENT DOCUMENTS

| KR | 10-2003-0001917 | 1/2003 |
| TW | 548802 B | 8/2003 |
| TW | 548838 B | 8/2003 |
| TW | 557565 B | 10/2003 |
| TW | 578300 B | 3/2004 |
| TW | 591705 B | 6/2004 |
| TW | 222209 B | 10/2004 |

* cited by examiner

*Primary Examiner*—Jerome Jackson, Jr.
*Assistant Examiner*—Paul A Budd
(74) *Attorney, Agent, or Firm*—Mills & Onello LLP

(57) ABSTRACT

In a DRAM device having a capacitor and a method thereof, the capacitor included in the device is characterized to have a lower electrode that passes through a plurality of interlayer insulating layers. A first interlayer insulating layer is formed on a semiconductor substrate. A first contact plug layer is formed through the first interlayer insulating to electrically contact the semiconductor substrate. An insulating layer is formed on the first interlayer insulating layer. The insulating layer is etched to form the first interlayer insulating layer and a temporary storage node hole exposing the first contact plug. The first interlayer insulating layer exposed by the temporary storage node hole and portions of the first contact plug are simultaneously etched to form a storage node hole. A lower electrode layer is conformally formed on a surface of the semiconductor substrate having the storage node hole. A planarization process is performed with respect to the lower electrode layer to remove the lower electrode layer on the insulating layer and simultaneously to form a cup-shaped lower electrode in the storage node hole. Furthermore, a dielectric layer and an upper electrode are formed to cover conformally and sequentially at least a bottom and inner sidewall of the cup-shaped lower electrode.

3 Claims, 14 Drawing Sheets

Cell Array Region | Peripheral Circuit Region

DRAM DEVICE HAVING CAPACITOR

CROSS-REFERENCE TO RELATED APPLICATIONS

This U.S. non-provisional patent application claims priority under 35 U.S.C. § 119 of Korean Patent Application 2004-110503 filed on Dec. 22, 2004, the entire contents of which are hereby incorporated by reference.

BACKGROUND OF THE INVENTION

The present invention relates to semiconductor devices and methods thereof and more particularly, to DRAM devices having a capacitor and methods thereof.

In semiconductor devices such as DRAMs (Dynamic Random Access Memory), each cell is composed of one transistor and one capacitor. In DRAMs, cells require periodic reading and refreshing. Owing to the advantages of low price-per-unit-bit, high integration, and ability to simultaneously perform read and write operations, DRAMs have enjoyed widespread use in commercial applications. In the meantime, a phenomenon referred to as "soft error" can be caused in DRAM devices by a loss of charge that was stored in a capacitor due to external factors, thereby causing malfunction of DRAMs. In order to prevent the occurrence of soft error, a method of enhancing the capacitance of a capacitor has been suggested. The capacitance of the capacitor can be enhanced by increasing the surface area of a lower electrode. Although many studies have been investigated in the area of increasing the lower electrode surface area, challenges are presented in formulating practical manufacturing processes due to the ever increasing high level of integration of semiconductor devices.

FIG. 1 is a cross-sectional view of a conventional DRAM device including a capacitor.

Referring to FIG. 1, a first interlayer insulating layer 3 is formed on a semiconductor substrate 1 having a cell array region and a peripheral circuit region. The first interlayer insulating layer 3 is patterned to form contact holes exposing the semiconductor substrates 1 on the cell array region and the peripheral circuit region respectively, and the contact holes are filled with a conductive material to form a lower electrode contact plug 5A and a peripheral circuit contact plug 5B. An etch stop layer 7 and a second interlayer insulating layer 9 are sequentially formed on the resulting structure.

The second interlayer insulating layer 9 and the etch stop layer 7 are sequentially etched in the cell array region to form the lower electrode contact plug 5A and a storage node hole 11 exposing the first interlayer insulating layer 3 around the lower electrode contact plug. After a lower electrode layer 13 is conformally stacked on the resulting structure, a planarization process is carried out to form a lower electrode 13 covering a bottom and an inner sidewall of the storage node hole 11. A dielectric layer 15 and an upper electrode layer 17 are sequentially stacked and patterned on the semiconductor substrate 1. The third interlayer insulating layer 19, the second interlayer insulating layer 9 and the etch stop layer 7 are sequentially patterned in the peripheral circuit region to form a metal contact hole.(not shown) exposing the peripheral circuit contact plug 5B, and the metal contact hole is filled with a conductive material to form a metal contact plug 21.

In the conventional architecture shown in FIG. 1, methods are available for increasing the height of the lower electrode as a method for increasing the surface area of the lower electrode to increase capacitance. In one such method, the thickness of the second interlayer insulating layer where the lower electrode is positioned is increased. However, if the thickness of the second interlayer insulating layer is increased, the process burden is also increased because large amount of etching is required when the metal contact hole is formed. In addition, because of the large amount of etching required, the peripheral circuit contact plug 5b may not be exposed, and, as a consequence, the metal contact plug 21 and the peripheral circuit contact plug 5b may not be electrically connected. Thus, the reliability of the semiconductor device can be degraded.

SUMMARY OF THE INVENTION

The present invention is directed to a semiconductor device capable of securing adequate capacitance and having improved reliability, and a method thereof.

In one aspect, the present invention is directed to a semiconductor device comprising: a first interlayer insulating layer and a second interlayer insulating layer sequentially stacked on a semiconductor substrate; a first contact plug formed through a predetermined portion of the first interlayer insulating layer in the cell array region to contact the semiconductor substrate and having an upper surface that is lower than an upper surface of the first interlayer insulating layer; a cup-shaped lower electrode formed through the second interlayer insulating layer and a predetermined portion of the first interlayer insulating layer in the cell array region to contact the first contact plug; a dielectric layer and an upper electrode conformally and sequentially covering at least a bottom and an inner sidewall of the lower electrode; and a second contact plug formed through the first interlayer insulating layer in the peripheral circuit region to contact the semiconductor substrate and having an upper surface that is at the same height as the upper surface of the first interlayer insulating layer.

In one embodiment, the dielectric layer and the upper electrode cover an outer sidewall of the cup-shaped lower electrode having a cup shape on the first interlayer insulating layer. The semiconductor device may further comprise an etch stop layer interposed between the first interlayer insulating layer and the second interlayer insulating layer.

In another aspect, the present invention is directed to a DRAM device comprising a semiconductor substrate having a cell array region and a peripheral circuit region; a device isolation layer formed in the semiconductor substrate to define an active region; a plurality of gate patterns on the active region; impurity doping regions positioned on the active region at sides of the gate patterns; a first interlayer insulating layer covering the semiconductor substrate; a first contact plug formed through the first interlayer insulating layer in the cell array region to contact the impurity doping region at a sidewall of the gate pattern and having an upper surface that is lower than an upper surface of the first interlayer insulating layer; a second contact plug formed through the first interlayer insulating layer in the peripheral circuit region to contact the semiconductor substrate and having an upper surface that is at the same height as the upper surface of the first interlayer insulating layer; a second interlayer insulating layer positioned over the first interlayer insulating layer; a cup-shaped lower electrode formed through portions of the second interlayer insulating layer and the first interlayer insulating layer to contact the first contact plug and separated from the gate pattern; and a dielectric layer and an upper electrode conformally and sequentially covering a bottom and an inner sidewall of the lower electrode.

In one embodiment, the DRAM device further comprises: a lower interlayer insulating layer interposed between the first interlayer insulating layer and the semiconductor substrate; a third contact plug formed through the lower interlayer insulating layer between two neighboring gate patterns in the cell array region to contact the semiconductor substrate; and a bit line positioned on the lower interlayer insulating layer to contact the third contact plug. At this time, the lower electrode is positioned at a level that is higher than the bit line and separated from the bit line.

In another embodiment, the DRAM device further comprises: a third contact plug formed through the first interlayer insulating layer between two neighboring gate patterns in the cell array region to contact the semiconductor substrate, a third interlayer insulating layer on the second interlayer insulating layer; a fourth contact plug formed through the third interlayer insulating layer and the second interlayer insulating layer to contact the second contact plug; and a bit line positioned on the third interlayer insulating layer to contact the fourth contact plug. In another embodiment, in the peripheral circuit region, a third contact plug is formed through the first interlayer insulating layer to electrically contact the semiconductor substrate. At this time, the third contact plug has an upper surface that has the same height as the height of the first interlayer insulating layer.

In another aspect, the present invention is directed to a method for forming a semiconductor device comprising: forming a first interlayer insulating layer on a semiconductor substrate having a cell array region and a peripheral circuit region; forming a first contact plug and a second contact plug to electrically contact the semiconductor substrate through the first interlayer insulating layer and to be positioned in the cell array region and the peripheral circuit region, respectively; forming an insulating layer on the first interlayer insulating layer; etching the insulating layer on the cell array region to form a temporary storage node hole exposing the first interlayer insulating layer and the first contact plug; simultaneously etching portions of the first contact plug and the first interlayer insulating layer exposed by the temporary storage node hole in the cell array region and to form a storage node hole; conformally forming a lower electrode layer on a surface of the semiconductor substrate having the storage node hole; performing a planarization process with respect to the lower electrode to remove the lower electrode layer on the insulating layer and simultaneously to form a cup-shaped lower electrode in the storage node hole; and forming a dielectric layer and an upper electrode to conformally and sequentially cover at least a bottom and an inner sidewall of the cup-shaped lower electrode.

In one embodiment, simultaneously etching portions of the first contact plug and the first interlayer insulating layer is carried out using an etch recipe where an etch rate of the first interlayer insulating layer is substantially the same as an etch rate of the first contact plug.

In another embodiment, the first contact plug and the second contact plug are formed of tungsten, and the first interlayer insulating layer is formed of silicon oxide layer.

In another embodiment, the etch recipe uses a methane fluoride ($CHF_3$) gas and a carbon tetra fluoride ($CF_4$) gas as etch gases.

In another embodiment, the dielectric layer and the upper electrode are extended to partially cover a top of the insulating layer.

In another embodiment, the method further comprises removing the insulating layer, and wherein the dielectric layer and the upper electrode are extended to partially cover the outer sidewall of the lower electrode and an upper portion of the first interlayer insulating layer.

In another embodiment, the method further comprises: forming an etch stop layer after the first contact plug and the second contact plug are formed, and wherein the etch stop layer is etched when the insulating layer is etched to form the temporary storage node hole.

In another aspect, the present invention is directed to a method of forming a DRAM device comprising: preparing a semiconductor substrate having a cell array region and a peripheral circuit region; forming a device isolation layer in the semiconductor substrate to define an active region; forming a plurality of gate patterns on the active region; forming a first interlayer insulating layer on the gate patterns and the semiconductor substrate; forming a first contact plug to contact the active region through the first interlayer insulating layer at a side of the gate pattern in the cell array region, and forming a second contact plug to contact the active region through the first interlayer insulating layer in the peripheral circuit region; forming an insulating layer on the first interlayer insulating layer; etching the insulating layer in the cell array region to form a temporary storage node hole exposing the first contact plug and the first interlayer insulating layer around the first contact plug; simultaneously etching upper portions of the first contact plug and the first interlayer insulating layer exposed by the temporary storage node hole to form a storage node hole; conformally forming a lower electrode layer on a surface of the semiconductor substrate having the storage node hole; performing a planarization process with respect to the lower electrode layer to remove the lower electrode layer on the insulating layer and simultaneously to form a cup-shaped lower electrode in the storage node hole; and forming a dielectric layer and an upper electrode to conformally and sequentially cover at least a bottom and an inner sidewall of the cup-shaped lower electrode.

In one embodiment, simultaneously etching upper portions of the first interlayer insulating layer and the first contact plug is carried out using an etch recipe where an etch rate of the first interlayer insulating layer is substantially the same as an etch rate of the first contact plug.

In another embodiment, the first contact plug and the second contact plug are formed of tungsten, and the first interlayer insulating layer is formed of a silicon oxide layer.

In another embodiment, the etch recipe uses a methane fluoride ($CHF_3$) gas and a carbon tetra fluoride ($CF_4$) gas as etch gases.

In another embodiment, the method further comprises forming an etch stop layer after the first contact plug and the second contact plug are formed, wherein the etch stop layer is etched when the insulating layer is etched to form the temporary storage node hole.

In another embodiment, the dielectric layer and the upper electrode are extended to partially cover an upper surface of the insulating layer.

In another embodiment, the method further comprises removing the insulating layer, and wherein the dielectric layer and the upper electrode are extended to partially cover the outer sidewall of the lower electrode and the upper portion of the first interlayer insulating layer.

In another embodiment, the method further comprises before forming the first interlayer insulating layer, forming a lower interlayer insulating layer; forming a third contact plug through the lower interlayer insulating layer between two neighboring gate patterns in the cell array region to contact the semiconductor substrate; and forming a bit line contacting the third contact plug on the lower interlayer insulating layer, wherein the lower electrode is positioned over the bit line but separated from the bit line.

In another embodiment, forming the insulating layer is preceded by forming a third contact plug through the first interlayer insulating layer between two neighboring gate patterns in the cell array region; and forming the upper electrode is followed by: forming a third interlayer insulating layer on the insulating layer; forming a fourth contact plug to contact the third contact plug through the third interlayer insulating layer and the second interlayer insulating layer; and forming a bit line contacting the fourth contact plug on the third interlayer insulating layer.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EMBODIMENT OF THE INVENTION

Figure 1:
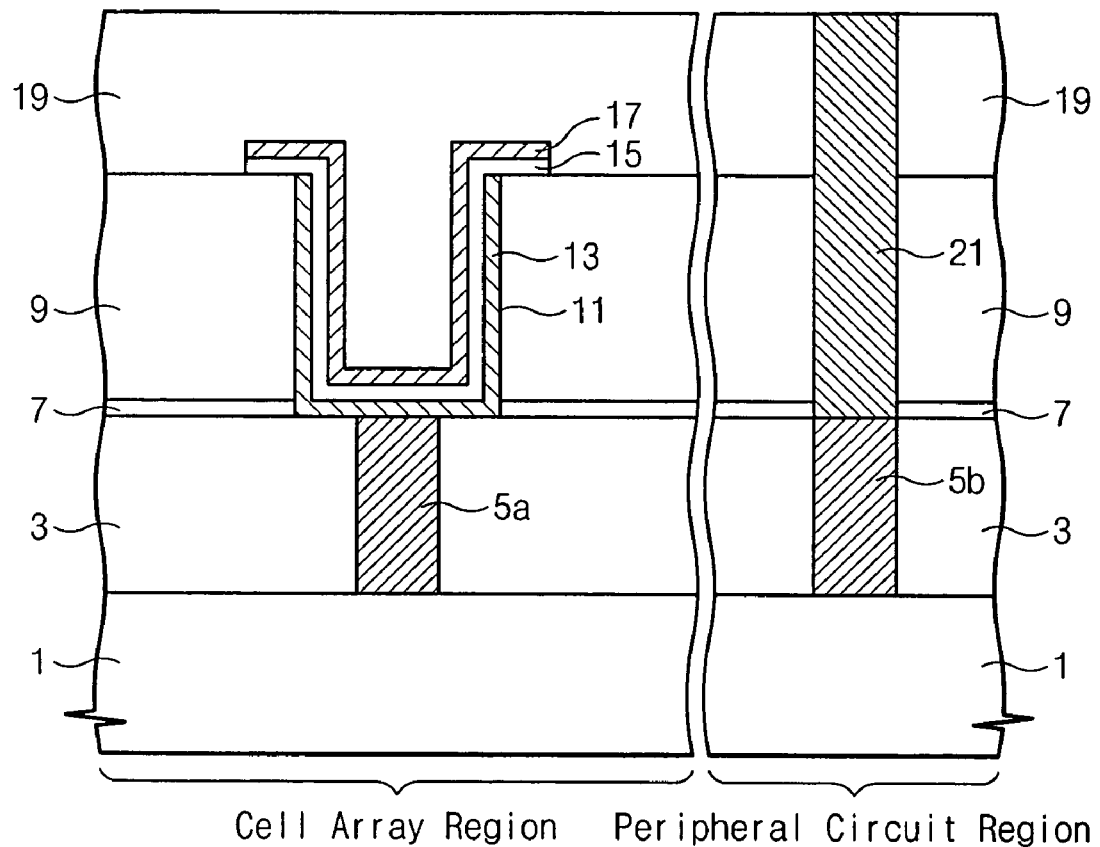
FIG. 1 is a cross-sectional view of a conventional DRAM device having a capacitor.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete. In the drawings, the thickness of layers and regions are exaggerated for clarity. It will also be understood that when a layer is referred to as being "on" another layer or substrate, it can be directly on the other layer or substrate, or intervening layers may also be present.

Figure 2:
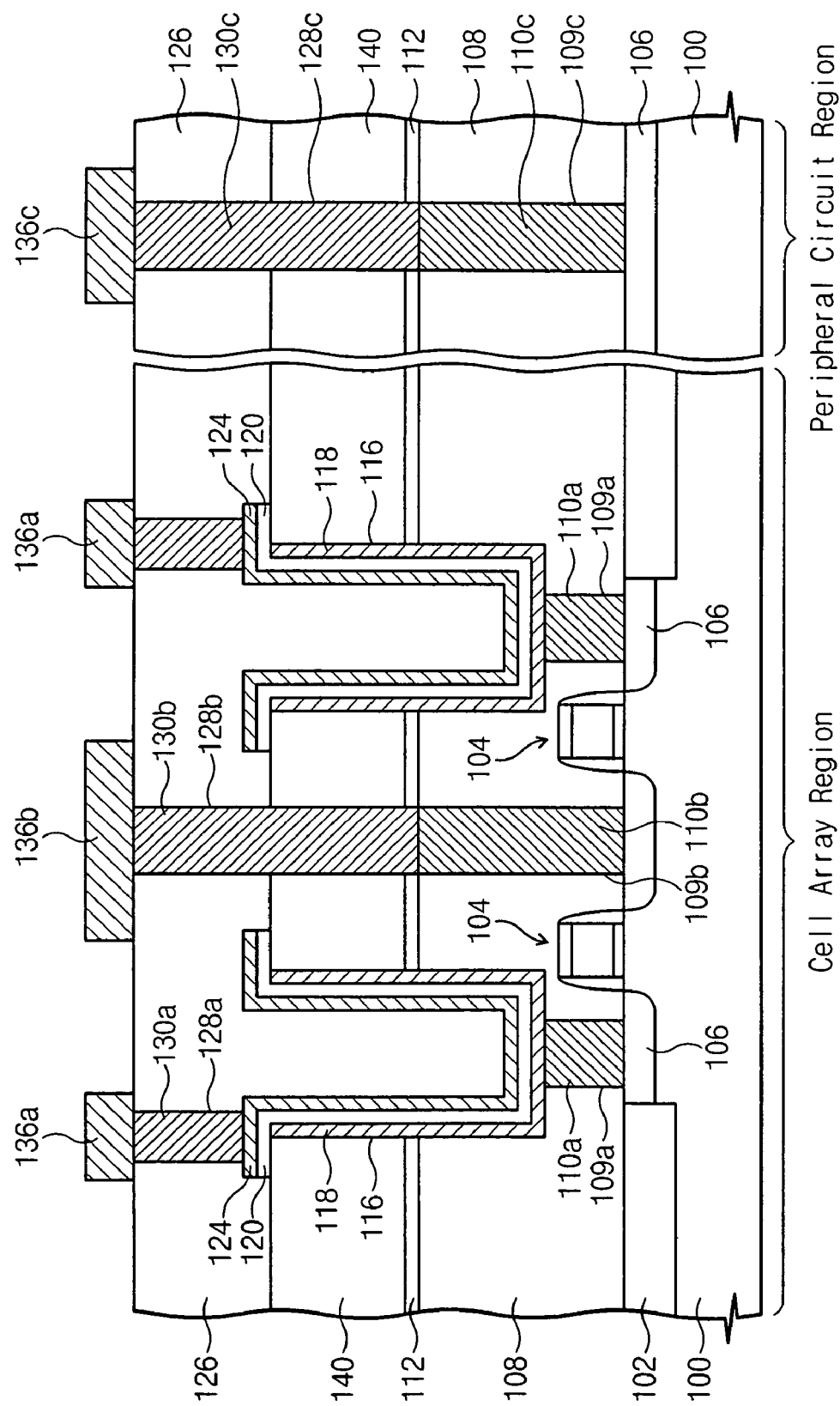
FIG. 2 is a cross-sectional view of a DRAM device having a capacitor in accordance with an embodiment of the present invention.

FIG. 2 is a cross-sectional view of a DRAM device having a capacitor in accordance with an embodiment of the present invention.

Referring to FIG. 2, a device isolation layer 102 is positioned on the semiconductor substrate 100 to define an active region. A plurality of gate patterns 104 including a gate insulating layer, a gate electrode, a capping layer pattern and a spacer are positioned on the active region. An impurity doping region 106 is on the active region at both sides of the gate patterns 104 to function as a source/drain. A first interlayer insulating layer 108 covers the semiconductor substrate 100.

A first contact plug 110A having an upper surface lower than a top surface of the first interlayer insulating layer 108 to contact the impurity doping region 106 at a side of the gate pattern 104 in the cell array region is in the first contact hole 109A. The first contact plug 110A is a lower electrode contact plug. A second contact plug 110B penetrating the first interlayer insulating layer 108 between two neighboring gate patterns 104 in the cell array region to contact the impurity doping region 106 is positioned in a second contact hole 110B. In the meantime, a third contact plug 110C is positioned in a third contact hole 109C in the peripheral circuit region. In the present embodiment, the second contact plug 110B and the third contact plug 110C may have the same height while the first contact plug 110A has a height that is low relative to the second contact plug 110B and the third contact plug 110C. The contacts 110A, 110B and 110C are formed of the same material, for example, tungsten.

An etch stop layer 112 and a second interlayer insulating layer 140 are sequentially stacked on the first interlayer insulating layer 108. In the cell array region, a lower electrode 118 is positioned in a storage node hole 116 formed to penetrate the second interlayer insulating layer 140, the etch stop layer 112 and the upper surface of the first interlayer insulating layer 108 to contact the first contact plug 110A. In addition, a dielectric layer 120 and an upper electrode 124 conformally and sequentially cover the inner sidewall and the bottom of the lower electrode 118. Here, as the lower electrode 118 has a structure extended in the first interlayer insulating layer 108 in comparison with the conventional architecture, it is possible to increase surface area and improve capacitance of the resulting capacitor. The upper surface of the dielectric layer 120 and the upper electrode 124 may partially cover the second interlayer insulating layer 140. The dielectric layer 120 can, for example, be formed of a high-k dielectric material such as a tantalum oxide $Ta_2O_5$ layer, a hafnium oxide layer $HfO_2$, or an aluminum oxide $Al_2O_3$ layer.

A third interlayer insulating layer 126 is positioned on the second interlayer insulating layer 140 having a capacitor consisting of the lower electrode 118, the dielectric layer 120 and the upper electrode 124. In the cell array region, an upper electrode contact plug 130A penetrating the third interlayer insulating layer 126 to contact the upper electrode 124 is positioned in the upper electrode contact hole 128A. A fourth contact plug 130B penetrating the third interlayer insulating layer 126, the second interlayer insulating layer 140 and the etch stop layer 12 sequentially between two neighboring capacitors is positioned in a fourth contact hole 128B. In the meantime, in the peripheral circuit region, a fifth contact plug 130C contacting with the third contact plug 110C is positioned in the fifth contact hole 128C. Although not shown in FIG. 2, a conductive interconnection may be interposed between the third contact plug 110C and the fifth contact plug 130C in the peripheral circuit region.

A first conductive pattern 136A, a bit line 136B and a second conductive pattern 136C are positioned on the third interlayer insulating layer to contact the upper electrode contact plug 130A, the fourth contact plug 130B and the fifth contact plug 130C, respectively.

FIG. 2 illustrates a structure of a DRAM device that is capable of effectively increasing the surface area of the lower electrode in a state where the capacitor is positioned at a lower portion of a bit line.

FIGS. 3 to 6 are cross-sectional views sequentially illustrating a method for forming the DRAM device of FIG. 2.

Figure 3:
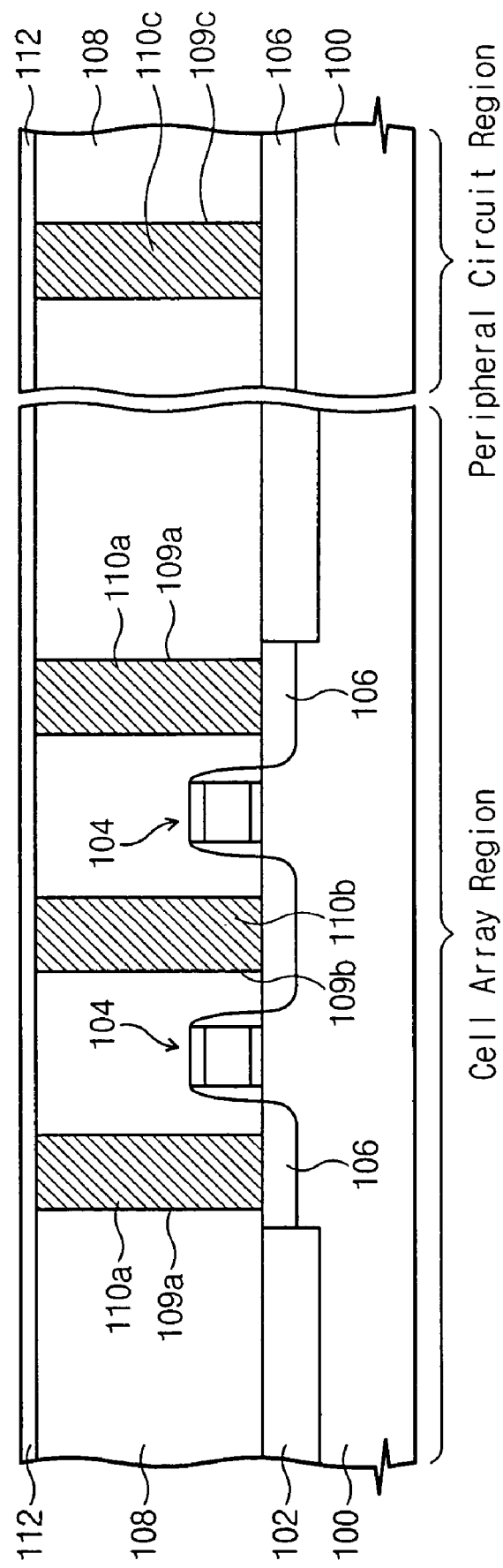
FIGS. 3 to 6 are cross-sectional views sequentially illustrating a method for forming the DRAM device of FIG. 2.

Referring to FIG. 3, a device isolation layer 102 is formed on a semiconductor substrate 100 to define an active region. The device isolation layer 102 may be formed by a shallow trench isolation STI method. A thermal oxidation process is carried out to form a gate insulating layer on the active region. A gate conductive layer and a capping layer are sequentially stacked and patterned to form a gate pattern 104 having a gate insulating layer, a gate electrode and a capping layer pattern. The gate pattern 104 may include a spacer that covers a sidewall. An ion implantation process is carried out using the gate pattern 104 as an ion implantation mask to form an impurity doping region 106. A first interlayer insulating layer 108 is formed on an entire surface of the semiconductor substrate 100. The first interlayer insulating layer 108 is etched to form a first contact hole 109A exposing the impurity doing regions 106 at a side of the gate pattern 104 in the cell array region, a second contact hole 109B exposing the impurity doping region 106 between two neighboring gate patterns 104 in the cell array region, and a third contact hole 109C exposing the impurity doping region 106 in the peripheral circuit region. For example, a conductive layer is formed of a tungsten layer to fill the contact holes 109A, 109B and 109C. A planarization process is carried out with respect to the conductive layer to form a first contact plug 110A, a second contact plug 110B and a third contact plug 110C respectively in the contact holes 109A, 109B and 109C. An etch stop layer 112 is formed of a silicon nitride layer on an entire surface of the semiconductor substrate 100 on which the contact plugs 110A, 110B and 110C are formed.

Figure 4:
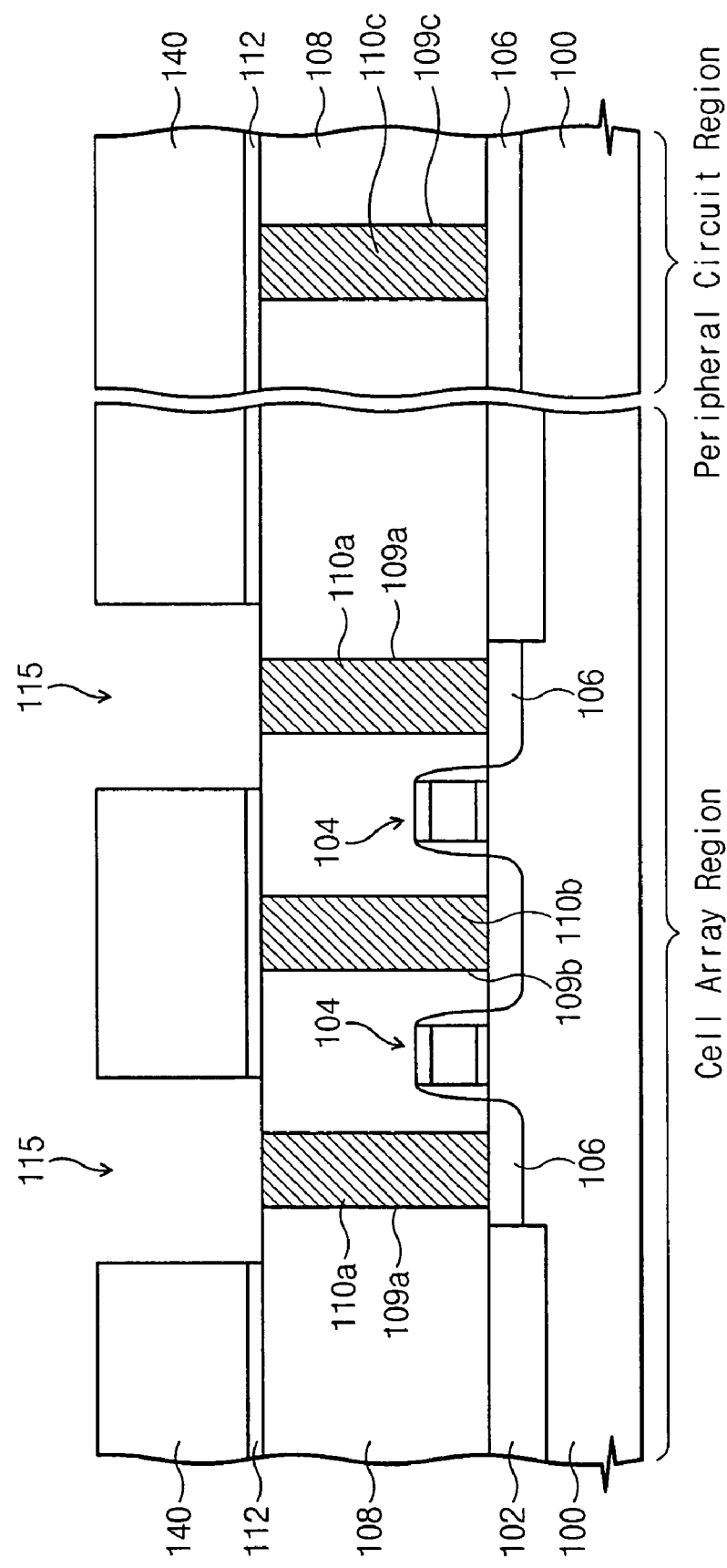

Referring to FIG. 4, a second interlayer insulating layer 140 is formed on the etch stop layer 112. Although not shown in FIG. 4, a photoresist pattern is formed on the second interlayer insulating layer 140. The second interlayer insulating layer 140 and the etch stop layer 112 are etched using the photoresist pattern (not shown) as an etch mask to form a temporary storage node hole 115 exposing the first contact plug 110A and the first interlayer insulating layer 108 around the first contact plug 110A.

Figure 5:
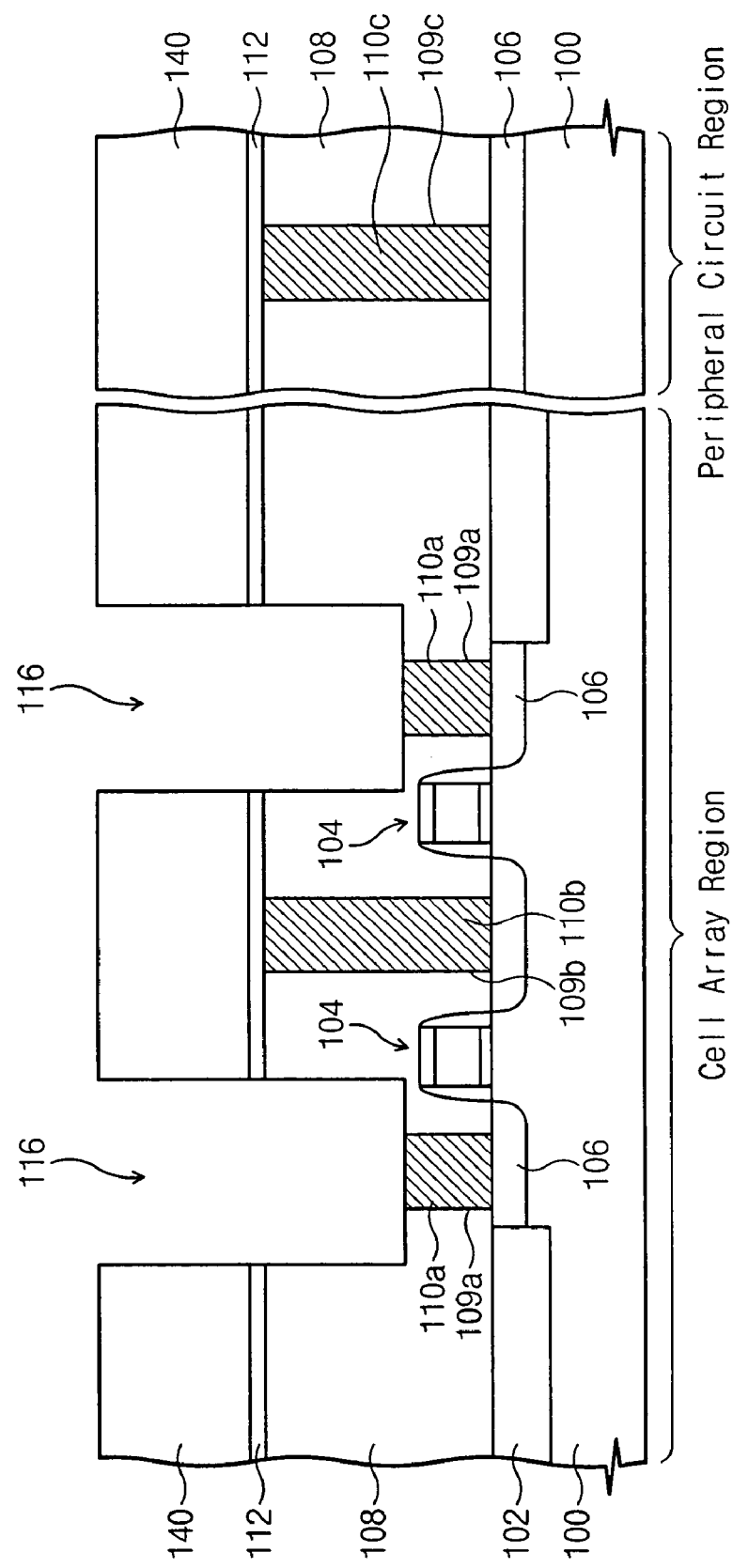

Referring to FIG. 5, the first contact plug 110A exposed by the temporary storage node hole 115 and the first interlayer insulating layer 108 are simultaneously etched using the photoresist pattern (not shown) as an etch mask to form a storage node hole 116. At this time, the etch process may proceed using a recipe where the speed of etching the first contact plug 110A is the same as the speed of etching the first interlayer insulating layer 108. In one embodiment, the first contact plug 110A is formed of tungsten, and the first interlayer insulating layer 108 uses a methane fluoride $CHF_3$ gas and a carbon tetra fluoride $CF_4$ gas as an etching gas, if the first contact plug 110A is formed of a silicon layer material. The etch process is performed for a predetermined time period and completed to a predetermined depth so that the gate pattern 104 is not exposed. After the etch process is completed, the photoresist pattern is removed, and a cleaning process is performed with a cleaning liquid including a hydrofluoric acid HF to remove a high molecule type byproduct that can reside in the storage node hole 116.

Figure 6:
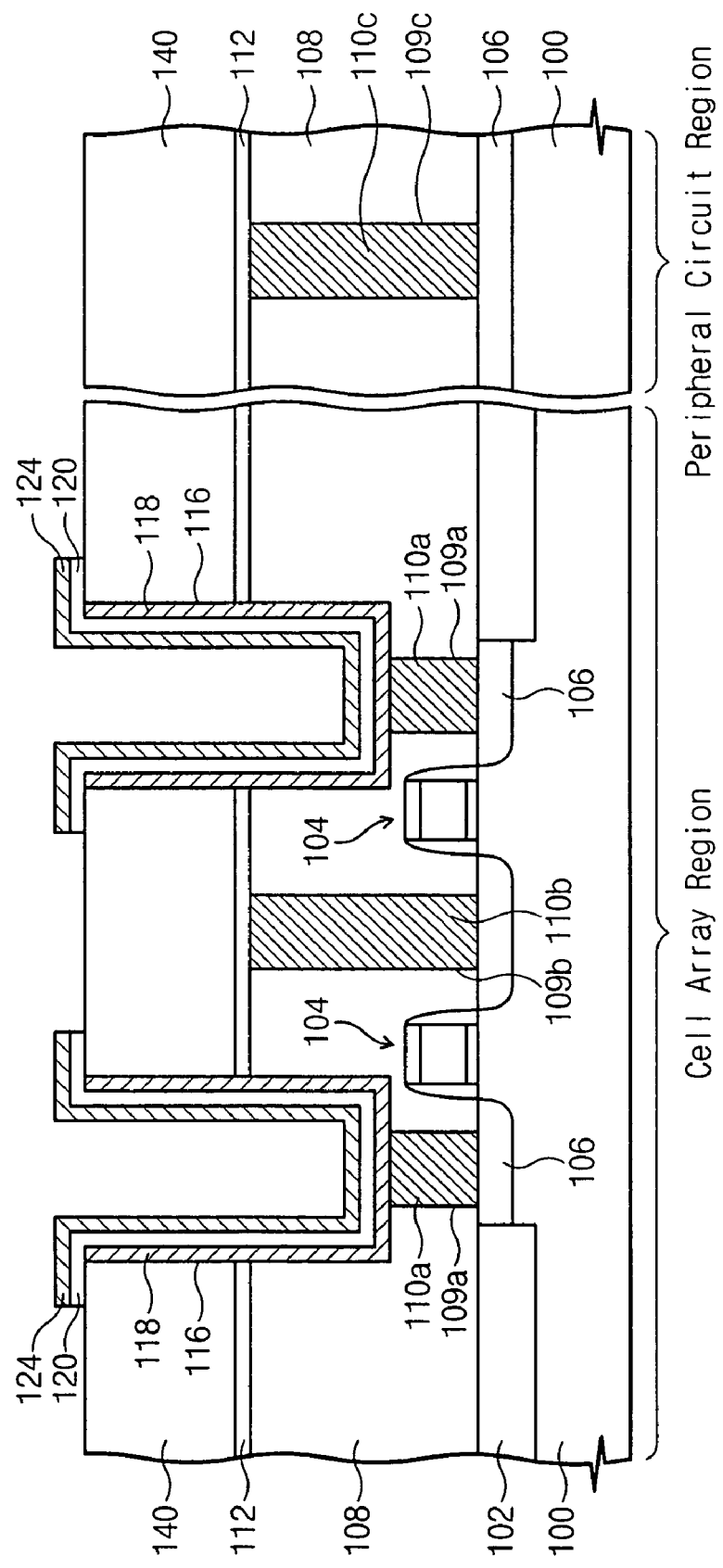

Referring to FIG. 6, a lower electrode layer (not shown) is conformally stacked on the semiconductor substrate 100. The lower electrode layer can be formed, for example, of a metal containing layer such as titanium, a titanium nitride layer, tantalum and a tantalum nitride layer. Although not shown in FIG. 6, a sacrificial oxide layer and a planarization process is carried out to expose the second interlayer insulating layer 140 and, at the same time, to form a lower electrode 118 conformally covering the bottom and the inner sidewall of the storage node hole 116. The sacrificial oxide layer is removed. The dielectric layer 120 and the upper electrode layer are conformally formed and patterned to expose the second interlayer insulating layer 140 and at the same time to form an upper electrode 124. The upper electrode 124 may be formed as a metal containing layer. The dielectric layer 120 may be formed of a high-k dielectric material such as a tantalum oxide $Ta_2O_5$ layer, a hafnium oxide layer $HfO_2$ and an aluminum oxide $Al_2O_3$ layer.

Subsequently, referring back to FIG. 2, a third interlayer insulating layer 126 is formed. The third-interlayer insulating layer 126 is patterned to form an upper electrode contact hole 128A exposing the upper electrode. The third interlayer insulating layer 126, the second interlayer insulating layer and the etch stop layer 112 are sequentially etched to form a fourth contact hole 128B exposing the second contact plug 110B in the cell array region, and a fifth contact hole 128C exposing the third contact plug 110C in the peripheral circuit region. A conductive layer is stacked to fill the contact holes 128A, 128B and 128C and to form the upper electrode contact plug 130A, the fourth contact plug 130B and the fifth contact plug 130C, respectively. The fourth contact plug 130A is a bit line contact plug and the fifth contact plug 130C is a metal contact plug. A conductive layer is stacked and patterned to complete a structure of FIG. 2 where a first conductive pattern 136A, a bit line 136B and a second conductive pattern 136C are formed.

In the method described above, a lower electrode is formed not only in the second interlayer insulating layer 140 but also in the first interlayer insulating layer 108 to increase the surface area of the electrodes and to improve the capacitance of the resulting capacitor. Furthermore, according to the method, it is possible to form the first interlayer insulating layer 108 relatively thick and the second interlayer insulating layer 140 relatively thin. Accordingly, the process burden can be reduced when a bit line contact hole or a metal contact hole is formed.

Figure 7:
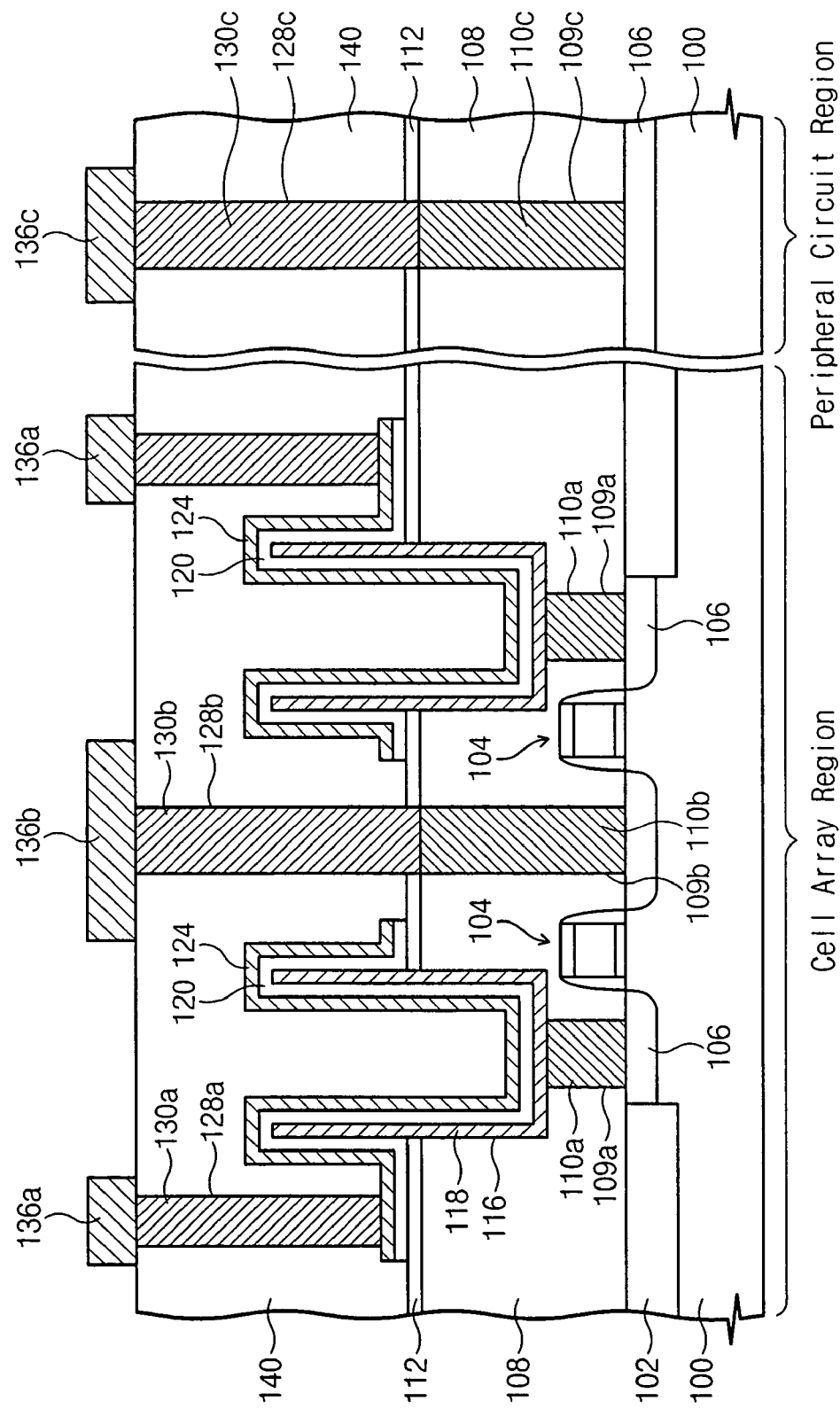
FIG. 7 is a cross-sectional view of a DRAM device having a capacitor in accordance with another embodiment of the present invention.

FIG. 7 is a cross-sectional view of a DRAM device having a capacitor in accordance with another embodiment of the present invention.

Referring to FIG. 7, the DRAM device in accordance with the present embodiment has a structure where the dielectric layer 120 and the upper electrode 124 cover an outer sidewall of the lower electrode 118 and a part of the etch stop layer 112. Therefore, the lower electrode 118 can be increased in surface area to improve capacitance of the resulting capacitor. In the meantime, the upper electrode contact plug 130A, the fourth contact plug 130B and the fifth contact plug 130C penetrate the second interlayer insulating layer 128C without the need for the third interlayer insulating layer 126 in FIG. 2 to be connected with the upper electrode 124, the second contact plug 110B and the third contact plug 110C, respectively. Furthermore, the topmost surface of the upper electrode 124 is lower than the upper surface of the second interlayer insulating layer 140.

FIG. 7 illustrates a structure of a DRAM device capable of more effectively increasing the surface area of the lower electrode in comparison with the structure of FIG. 2.

Figure 8:
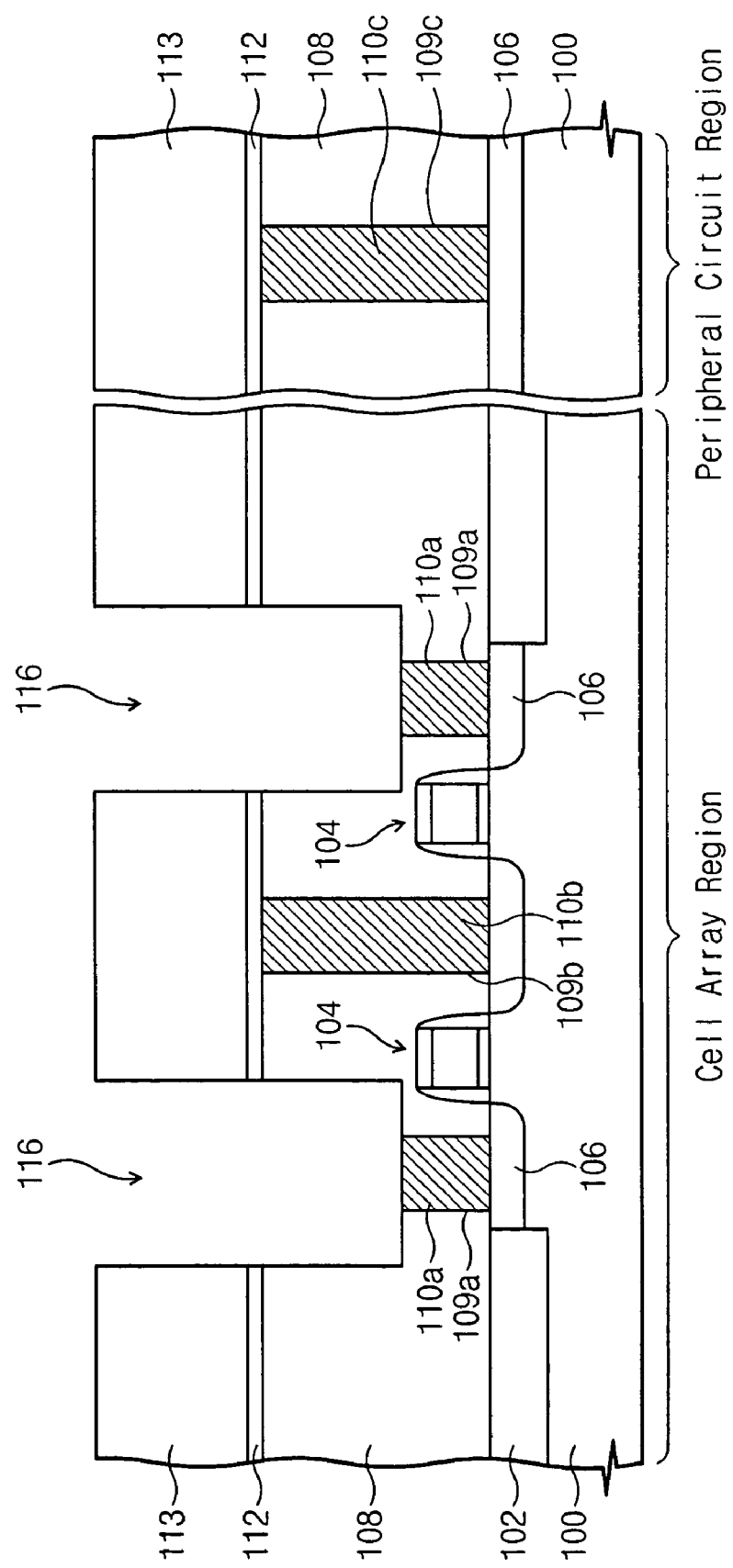
FIGS. 8 and 9 are cross-sectional views sequentially illustrating a method for forming the DRAM device of FIG. 7.
Figure 9:
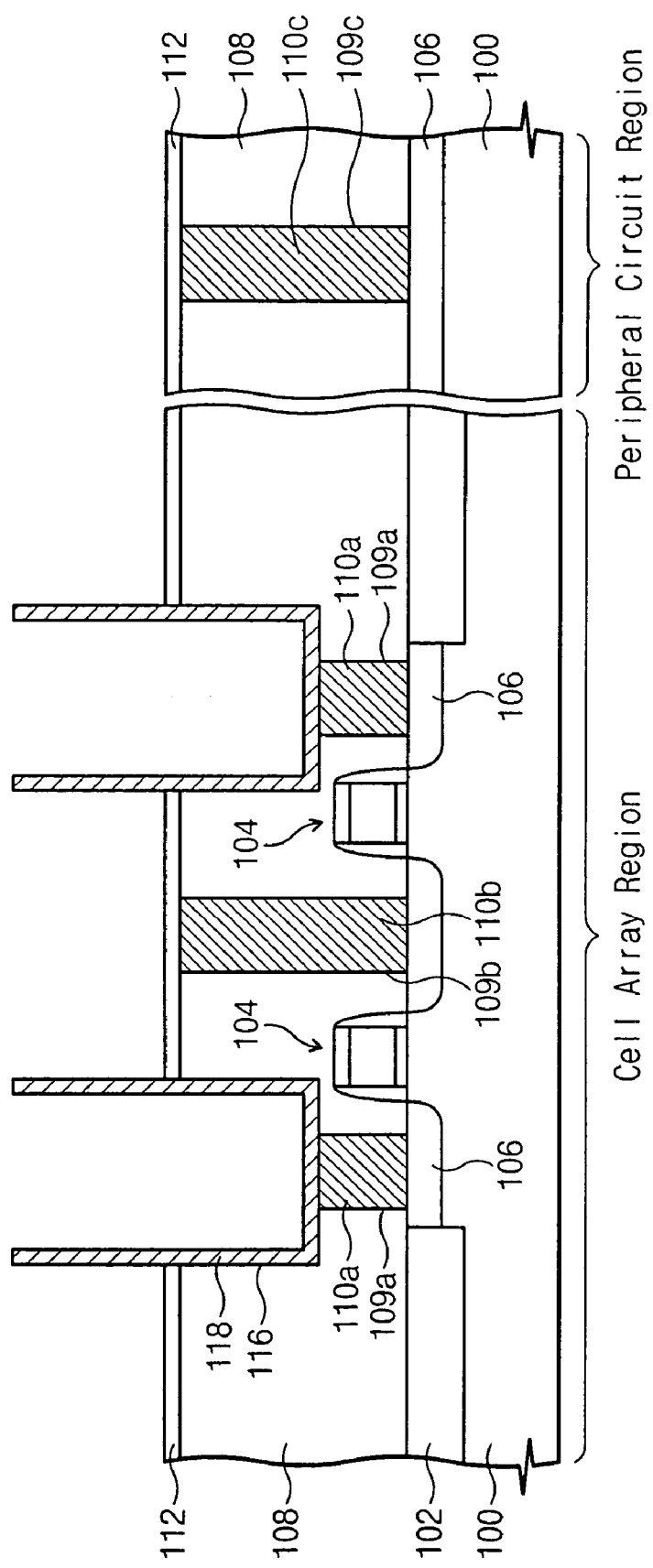

FIGS. 8 and 9 are cross-sectional views sequentially illustrating a method for forming the DRAM device of FIG. 7.

Referring to FIG. 8, a cast layer 113 is formed on the structure shown in FIG. 3. The cast layer 113 and the etch stop layer 112 at a lower portion of the cast layer 113 are etched to expose a first contact plug 110A and a temporary storage node hole (not shown) exposing the first interlayer insulating layer 108. In addition, as described in FIG. 5 above with respect to the first embodiment, the exposed first contact plug 110A and the first interlayer insulating layer 108 are etched at the same time to form a storage node hole 116. At this time, the etch process is completed to a depth so as not to expose the underlying gate pattern 104.

Referring to FIG. 9, a lower electrode layer is conformally applied to an entire surface of the semiconductor substrate 100 on which the storage node hole 116 is formed. Even not shown in FIG. 9, a sacrificial oxide layer is stacked and a planarization process is performed to expose the cast layer 113 and at the same time to form a lower electrode 118 in the storage node hole 116. Moreover, the sacrificial oxide layer (not shown) and the cast layer 113 at both sides of the lower electrode 118 are removed to expose the etch stop layer 112. The sacrificial oxide layer and the cast layer 113 may be removed at the same time, if they are formed of the same material. At this time, the first interlayer insulating layer 108 may play a role in supporting the lower electrode 118.

Subsequently, referring to FIG. 7, the dielectric layer 120 and the upper electrode layer 124 are conformally stacked and patterned to form a capacitor disclosed in FIG. 7. The second interlayer insulating layer 140 is stacked on the resulting structure. In addition, an upper electrode contact plug 130A, a fourth contact plug 130B and a fifth contact plug 130C are formed by an etch process. Other configuration elements, such as process conditions and layers are the same as those described above with reference to the first embodiment.

Figure 10:
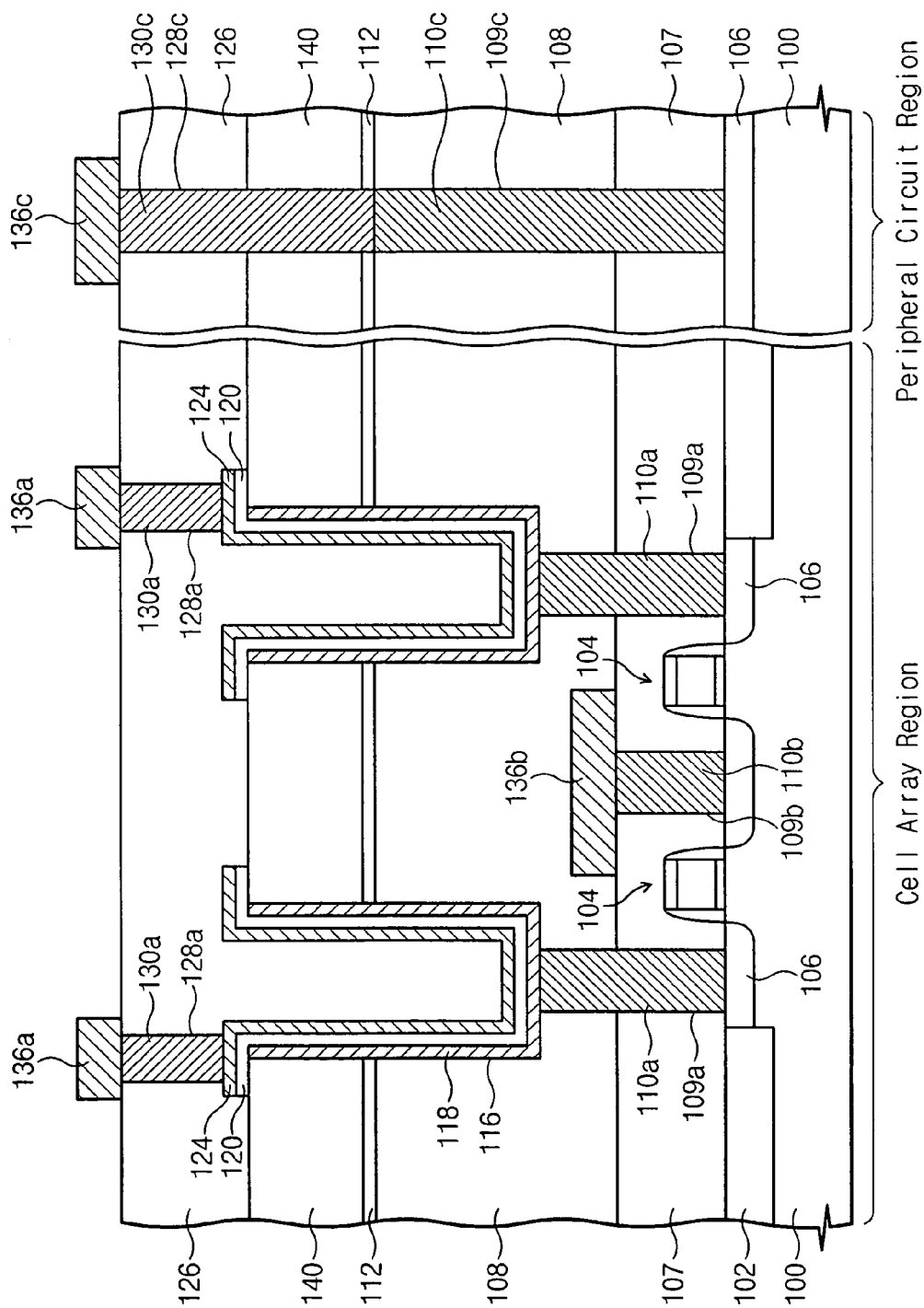
FIG. 10 is a cross-sectional view of a DRAM device having a capacitor in accordance with another embodiment of the present invention.

FIG. 10 is a cross-sectional view of a DRAM device having a capacitor in accordance with another embodiment of the present invention.

Referring to FIG. 10, a lower interlayer insulating layer 107 is interposed between the semiconductor substrate 100 on which the device isolation layer 102, gate patterns 104 and an impurity doping region 106, and the first interlayer insulating layer 108. In addition, the second contact plug 110B between two neighboring gate patterns 104 penetrates the lower interlayer insulating layer 107 to connect with the impurity doping region 106. Moreover, a bit line 136B is positioned to contact the second contact plug 110B on the lower interlayer insulating layer 107. In the meantime, the first contact plug 110A and the third contact plug 110C sequentially penetrate the first interlayer insulating layer 108 and the lower interlayer insulating layer 107 to contact the impurity doping region. The lower electrode 118 is positioned to pass through the second interlayer insulating layer, the etch stop layer 112 and the first interlayer insulating layer 108, and is separated from the bit line 136.

FIG. 10 shows a structure of a DRAM device capable of effectively increasing the surface area of the lower electrode in a configuration where the capacitor is positioned above the bit line.

Figure 11:
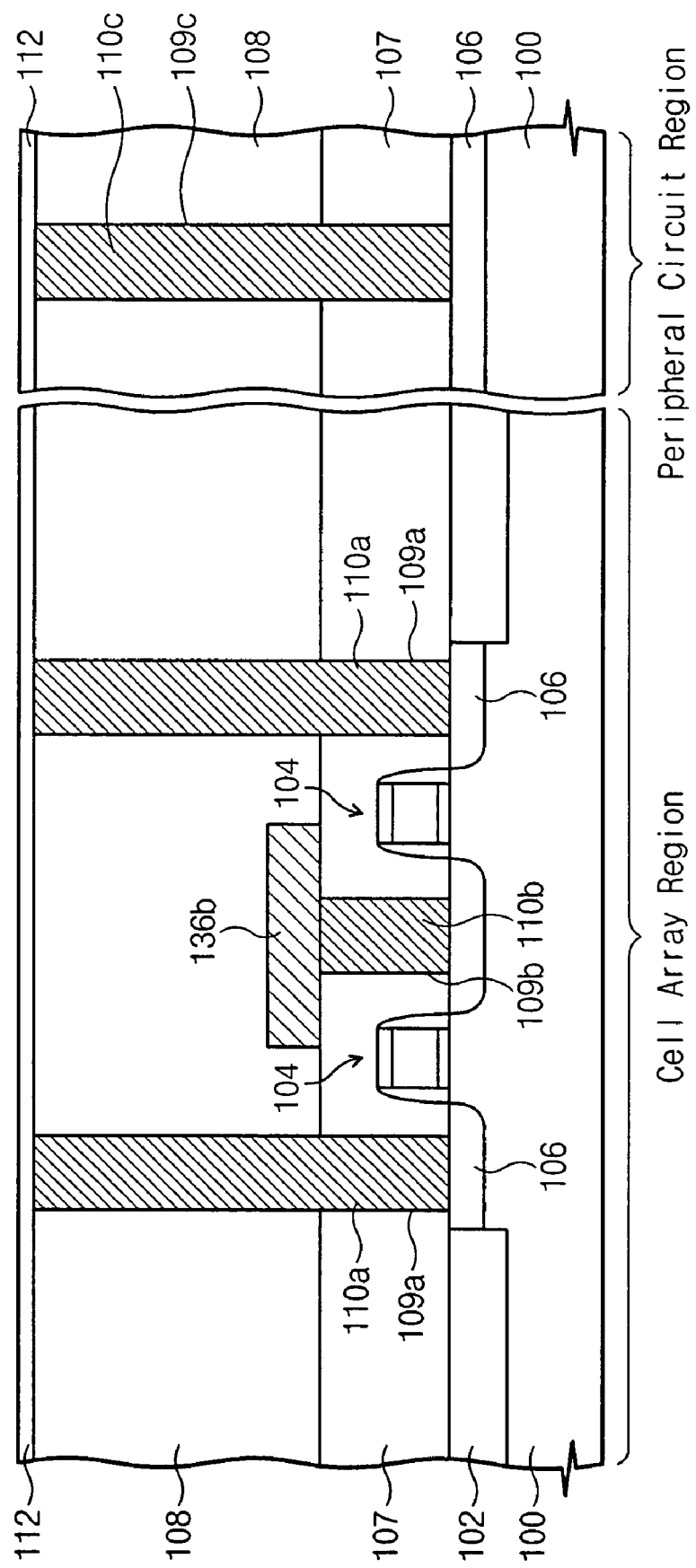
FIGS. 11 and 12 are cross-sectional views sequentially illustrating a method for forming the DRAM device of FIG. 10.
Figure 12:
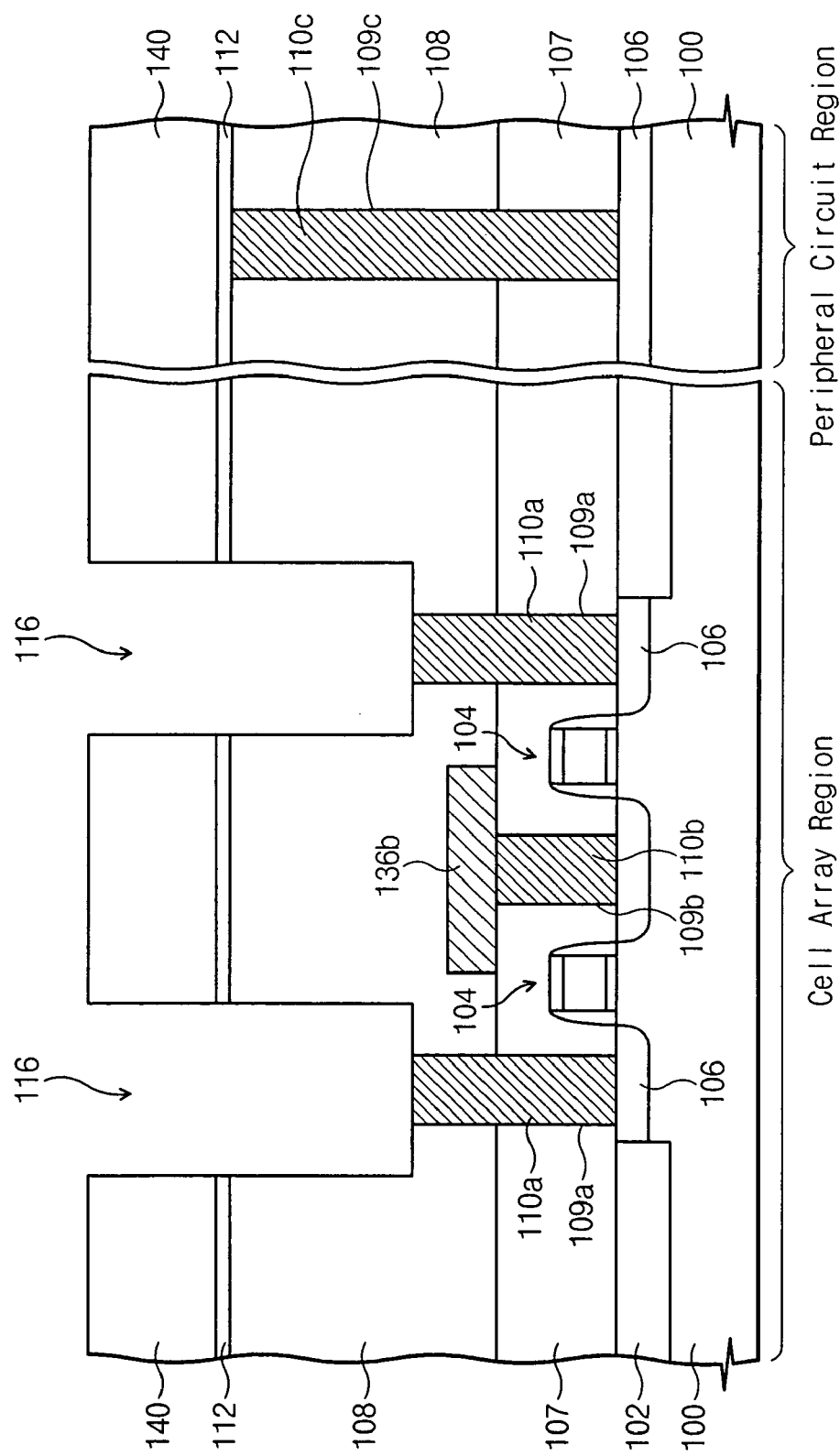

FIGS. 11 and 12 are cross-sectional views sequentially illustrating a method for forming the DRAM device of FIG. 10.

Referring to FIG. 11, after a device isolation layer 102, a gate pattern 104 and an impurity doping region 106 are formed on a semiconductor substrate 100, a lower interlayer insulating layer 107 is formed. In the cell array region, the lower interlayer insulating layer 107 between two neighboring gate patterns 104 is etched to form a second contact hole 109B. The second contact hole 109B is filled with a conductive layer and a planarization process is performed to form a second contact plug 110B. A conductive layer is stacked and patterned on the lower interlayer insulating layer 107 to form a bit line 136B contacting the second contact plug 110B. The first interlayer insulating layer 108 is formed on the semiconductor substrate 100. The first interlayer insulating layer 108 and the lower interlayer insulating layer 107 are sequentially patterned in the cell array region and the peripheral circuit region to form a first contact hole 109A exposing the impurity doping region 106 and a third contact hole 109C. The first contact hole 109A and the third contact hole 109C are filled with a conductive material and a planarization process proceeds to form a first contact plug 110A and a third contact plug 110C. Accordingly, the first contact plug 110A and the third contact plug 110C are not formed at the same time the second contact plug 110B is formed, and therefore may optionally be formed of a different material. An etch stop layer 112 is then formed on the entire surface of the semiconductor substrate 100.

Referring to FIG. 12, a second interlayer insulating layer 140 is formed on the etch stop layer 112. Although not shown in FIG. 12, the second interlayer insulating layer 140 and the etch stop layer 112 are etched using a photoresist pattern (not shown) as an etch mask to form a temporary storage node hole (not shown) exposing the first contact plug 110A and the first interlayer insulating layer 108 around the first contact plug 110A. The first contact plug 110A exposed by the temporary storage node hole (not shown) and the first interlayer insulating layer 108 are simultaneously etched to form a storage node hole 116. At this time, the etch process is performed using an etch recipe where the speed of etching the first interlayer insulating layer 108 is the same as the speed of etching the first contact plug 110A. The etch process may be performed for a predetermined time period and completed at a predetermined depth so as not to expose the underlying bit line 136B. Subsequently, a lower electrode, a dielectric layer and an upper electrode are formed as shown above in FIG. 6. The other configuration elements of the present embodiment can be the same as those described above with reference the first embodiment.

Figure 13:
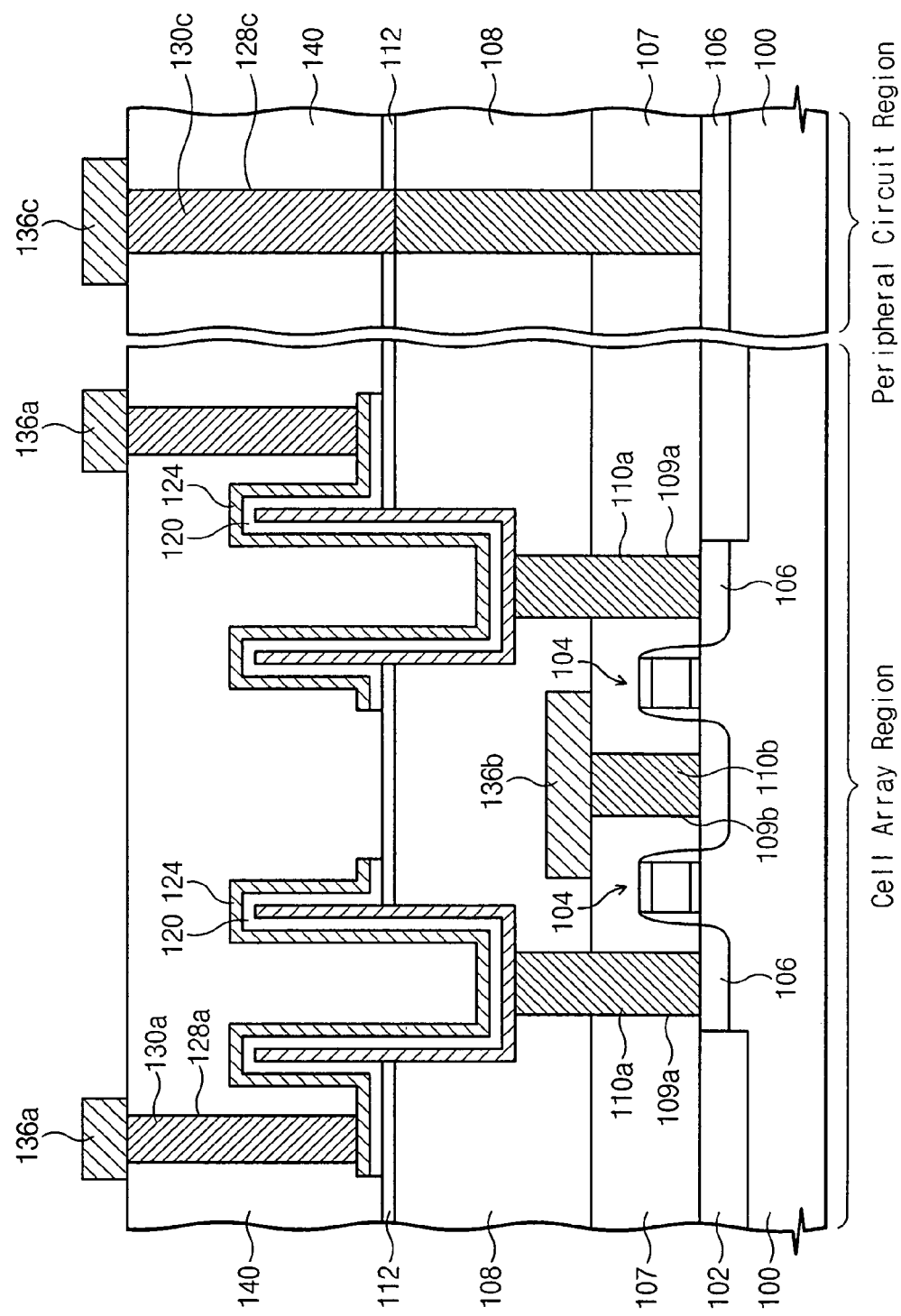
FIG. 13 is a cross-sectional view of a DRAM device having a capacitor in accordance with another embodiment of the present invention.

FIG. 13 is a cross-sectional view of a DRAM device having a capacitor in accordance with another embodiment of the present invention.

Referring to FIG. 13, a lower interlayer insulating layer 107 is positioned on the semiconductor substrate 100 on which a device isolation layer 102, gate patterns 104 and an impurity doping region 106 are formed. A second contact plug 110B between two neighboring gate patterns 104 penetrate the lower interlayer insulating layer 107 to be connected with the impurity doping region 106. A bit line 136B is positioned to contact the second contact plug 110B on the lower interlayer insulating layer 107. In the meantime, the first contact plug 110A and the third contact plug 110C sequentially penetrate the first interlayer insulating layer 108 and the lower interlayer insulating layer 107 to contact the impurity doping region. The lower electrode 118 is positioned to pass through the second interlayer insulating layer, an etch stop layer 112 and an upper surface of the first interlayer insulating layer 108, but is separated from the bit line 136. The DRAM device in accordance with the present embodiment has a structure where the dielectric layer 120 and the upper electrode 124 partially cover an outer sidewall of the lower electrode 118 and the etch stop layer 112. Thereby, the surface area of the lower electrode 118 can be more effectively increased to improve the capacitance of the resulting capacitor.

The DRAM device disclosed in FIG. 13 in accordance with the present embodiment has a structure capable of more effectively increasing the surface area of the lower electrode in a configuration where the capacitor is positioned above a bit line.

Figure 14:
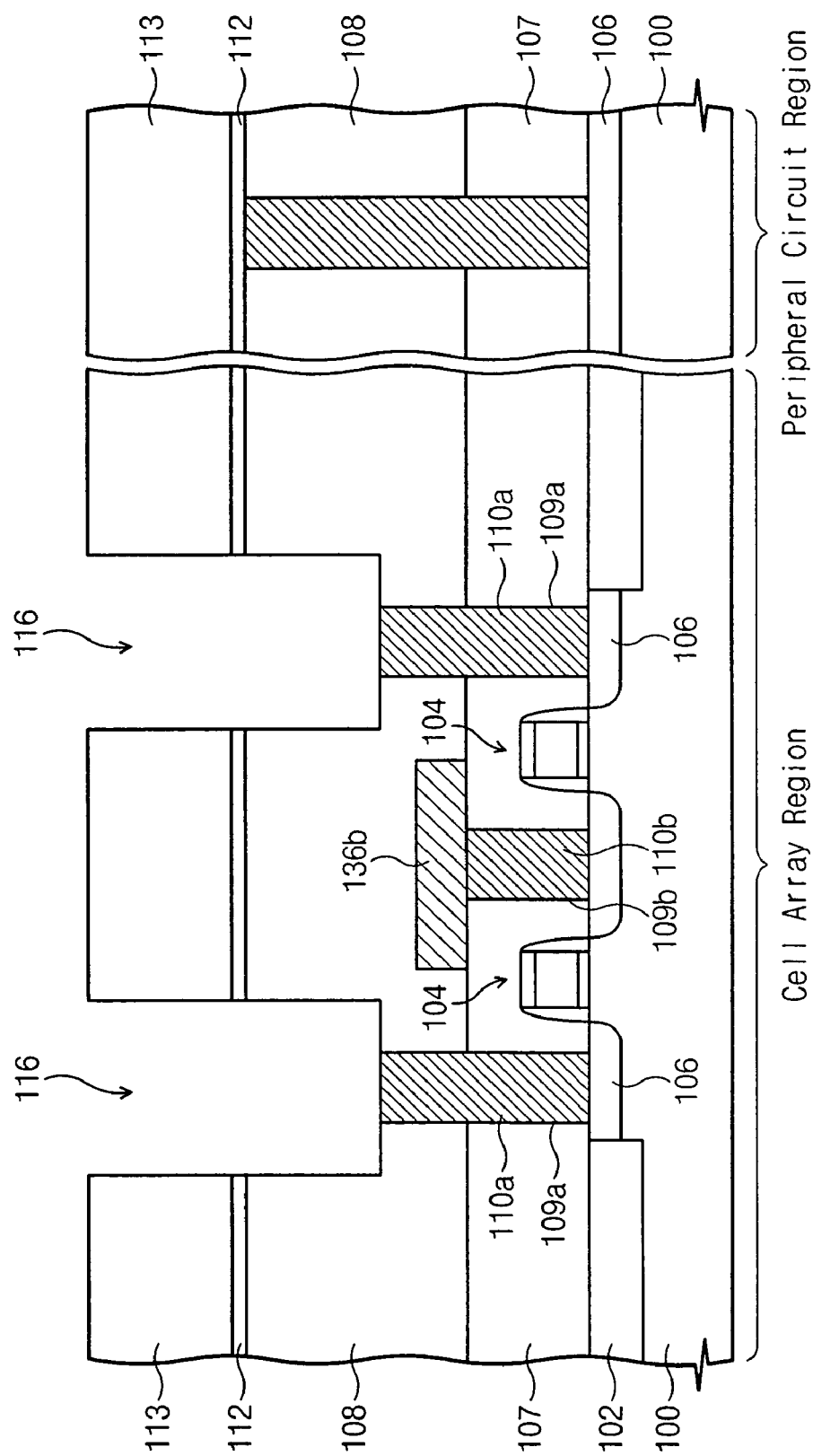
FIG. 14 is a cross-sectional view illustrating a method for forming a DRAM device in FIG. 13.

FIG. 14 is a cross-sectional view showing a method for forming the DRAM device of FIG. 13. A cast layer 113 is formed on the structure described above with reference to FIG. 11. Furthermore, the cast layer 113 and an etch stop layer 112 at a lower portion of the cast layer 113 are etched to form a temporary storage node hole (not shown) exposing a first contact plug 110A and a first interlayer insulating layer 108 around the first contact plug. In addition, as described in FIG. 12 in the third embodiment, the first contact plug 110A and the first interlayer insulating layer 108 are simultaneously etched to form a storage node hole 116. At this time, an etch process is completed at a depth such that the bit line 136B at a lower portion is not exposed.

Subsequently, referring to FIG. 13, a lower electrode layer is conformally stacked on an entire surface of the semiconductor substrate 100 on which the storage node hole 116 is formed. Although not shown in FIG. 13, a sacrificial oxide layer is stacked and a planarization process is performed to expose the cast layer 113 and to form a lower electrode 118 in the storage node hole 116. Moreover, the sacrificial oxide layer (not shown) and the cast layer 113 at both sides of the lower electrode 118 are removed to expose the etch stop layer 112. The dielectric layer 120 and the upper electrode layer 124 are conformally stacked and patterned to form a capacitor.

Therefore, according to a DRAM device in accordance with the present invention and a method thereof, a lower electrode having a cup shape is formed to pass through at least two interlayer insulating layers. Accordingly, capacitance may be improved without increasing the burden on the process when a subsequent metal contact is formed. Reliability of the DRAM device is thereby improved.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor device comprising:
    a first interlayer insulating layer and a second interlayer insulating layer sequentially stacked on a semiconductor substrate having a cell array region and a peripheral circuit region;
    a first contact plug formed through a predetermined portion of the first interlayer insulating layer in the cell array region to contact the semiconductor substrate and having an upper surface that is lower than an upper surface of the first interlayer insulating layer;
    a cup-shaped lower electrode formed through the second interlayer insulating layer and a predetermined portion of the first interlayer insulating layer in the cell array region to contact the first contact plug, wherein the first interlayer insulating layer has a thickness that is greater than a thickness of the second interlayer insulating layer;
    a dielectric layer and an upper electrode conformally and sequentially covering at least a bottom and an inner sidewall of the lower electrode; and
    a second contact plug formed through the first interlayer insulating layer in the peripheral circuit region to contact the semiconductor substrate and having an upper surface at the same height as the upper surface of the first interlayer insulating layer.

2. The semiconductor device of claim 1, wherein the dielectric layer and the upper electrode cover an outer sidewall of the cup-shaped lower electrode on the first interlayer insulating layer.

3. The semiconductor device of claim 1, further comprising an etch stop layer interposed between the first interlayer insulating layer and the second interlayer insulating layer.

* * * * *